(12) United States Patent
Matonis et al.

(10) Patent No.: US 6,272,016 B1
(45) Date of Patent: Aug. 7, 2001

(54) AVIONICS RACK WITH EXTERNAL ELECTRONICS MODULE

(76) Inventors: Richard A. Matonis, 13935 Rock Creek Rd., Poway, CA (US) 92064; David M. Smith, 2041 B. Orchard, Placentia, CA (US) 92870; John J. Arena, 1305 Ashley Rd., Ramona, CA (US) 92065

( * ) Notice: Subject to any disclaimer, the term of this patent is extended or adjusted under 35 U.S.C. 154(b) by 0 days.

(21) Appl. No.: 09/583,589

(22) Filed: May 31, 2000

(51) Int. Cl.[7] .......................................... H05K 7/20
(52) U.S. Cl. ..................... 361/716; 165/80.3; 211/41.17; 361/732
(58) Field of Search ..................... 312/236; 454/184; 174/15.1, 16.1; 62/414, 418; 211/41.17; 165/80.2, 80.3, 185; 254/104; 403/374, 409.1; 361/690, 694, 696, 701, 704, 707, 715, 716, 724–732, 796–798, 801–803

(56) References Cited

U.S. PATENT DOCUMENTS

| | | | |
|---|---|---|---|
| 4,149,218 | * | 4/1979 | Carrubba et al. . |
| 5,019,939 | * | 5/1991 | Reimer . |
| 5,237,484 | * | 8/1993 | Ferchau . |
| 5,262,587 | * | 11/1993 | Moser . |
| 5,715,140 | * | 2/1998 | Sinkunas . |
| 5,940,266 | * | 8/1999 | Hamilton . |
| 5,949,650 | * | 9/1999 | Bulante . |

* cited by examiner

Primary Examiner—Gerald Tolin
(74) Attorney, Agent, or Firm—Robert W. Keller

(57) ABSTRACT

A rack (70) for a plurality of internal electronics modules that includes a mechanism for mounting external electronics modules (69). The rack (70) includes a heat exchanger (63) disposed between the rack (70) and the external electronics module (69). The external electronics module (69) includes a heat coupling surface for efficiently using the heat exchanger (63) for dissipating heat of the external electronics module (69).

11 Claims, 3 Drawing Sheets

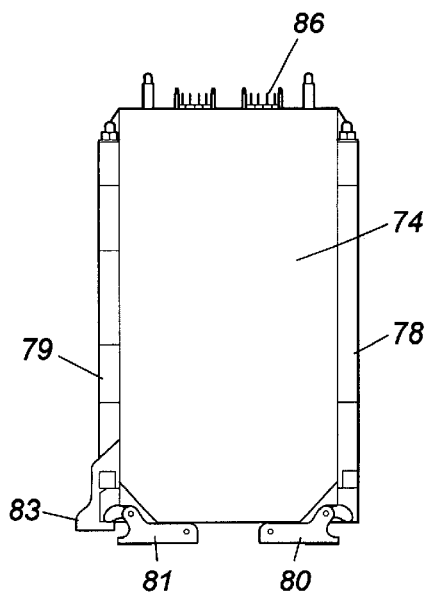
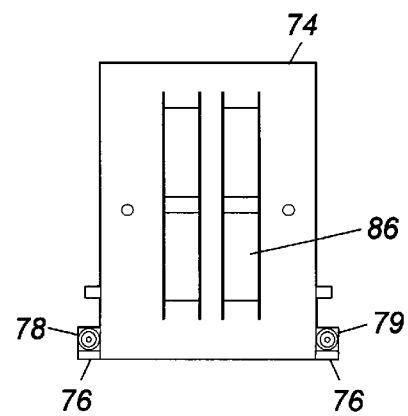
Fig. 4              Fig. 5
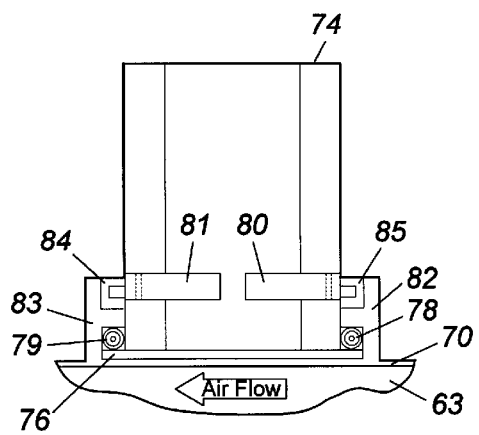
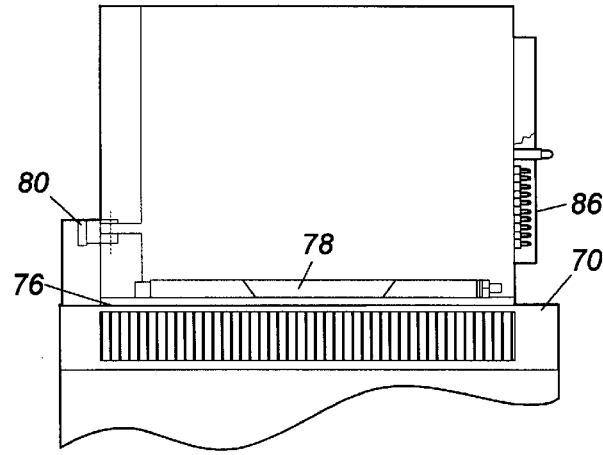
Fig. 6              Fig. 7

AVIONICS RACK WITH EXTERNAL ELECTRONICS MODULE

GOVERNMENT RIGHTS

This invention was made with Government support under Contract No. DAAJ09-91-C-A004 awarded by the U.S. Army. The Government has certain rights in this invention.

BACKGROUND OF THE INVENTION

1. Field of the Invention

This invention relates generally to a rack for mounting and connecting a plurality of electronics modules and, more particularly, to a rack for mounting and connecting a protected external module, which is coupled to a heat exchange unit.

2. Discussion of the Related Art

Many electronics systems employ independent electronic modules that are slideably positioned within an electronics rack, and electrically connected to each other therein. One particular known electronics rack is used for mounting and connecting avionics and electronics modules. As is well understood in the art, the operation of electronics systems generates heat. The closer the electronics modules are mounted together, the more heat is generated per unit volume, and the harder it is for the heat to dissipate. If too much heat is generated, the electronic modules may not operate amount of heat may create a fire hazard. Therefore, one of the primary focuses of the rack is to provide cooling of the modules.

In one rack design, cooling air is forced through a heat exchanger configured within the rack to provide cooling of the electronics modules. FIG. 1 is a perspective view of an electronics rack 10 of this type that is known in the art. The rack 10 includes an outer housing 12 having a front opening 14. A lower card guide 16 is mounted at a lower location within the housing 12 by flanges 18 secured to opposing side panels 20 and 22 of the housing 12. The card guide 16 is a single unit made of a heat conductive metal, such as aluminum. The card guide 16 includes a plurality of parallel tabs 28 extending from front to back that define a groove 30 there between each tab 28 includes an alignment nub 32 positioned proximate to the opening 14. An upper card guide (not shown) is also mounted within the housing 12 at an upper location in the same manner, and also includes parallel tabs defining grooves there between.

The parallel grooves 30 in the lower card guide 16 and the parallel grooves in the upper card guide are aligned and suitably spaced apart to receive internal electronics modules 36 in a certain configuration. Each internal electronics module 36 includes a lower rail 38 that is inserted in one of the grooves 30 in the lower guide 16 and the upper rail 40 that is inserted in the corresponding groove in the upper guide. When the internal electronics module 36 is slid into the housing 12, an electrical connector 42 is electrically connected with a meeting electrical connector (not shown) at the back of the housing 12 to provide the desired electrical connection. Multiple internal electronics modules 36 are slid into the housing 12 in a parallel format to provide the overall electrical system. It is generally desirable to set the spacing of the grooves 30 and thickness of the internal electronics modules 36 to allow as many modules as possible to be stored in the rack 10 to conserve space.

The internal electronics modules 36 generate heat during operation. The rack 10 therefore provides assisted cooling for the internal electronics module 36 to draw away the heat. FIG. 2 is a cross-sectional view of the rack 10-2 in FIG. 1. Rails 38 and 40 make contact with the lower card guide 16 and upper card guide in a heat transfer engagement. To provide the cooling, forced air is caused to circulate across the lower card guide 16 and upper card guide to draw heat away from the internal electronics modules 36. An inlet plenum 46 is attached to the side surface 20 at one side of the housing 12 and an outlet plenum 48 is attached to the surface 22 at an opposite side of the housing 12. Of course, the inlet and outlet plenums 46 and 48 can be reversed. The inlet plenum 46 includes a rectangular opening 50 through a back wall 52 of the housing 12 that allows cooling air to enter the plenum 46. The outlet plenum 48 includes a rectangular opening 54 through the wall 52 that allows the heated air to exit the outlet plenum 48 and the housing 12.

A heat exchanger 60 is positioned within a specially configured cavity and a base plate 62 between the bottom wall of the housing 12 and the card guide 16. A similar heat exchanger 63 is also provided between the top wall and the upper card guide. The heat exchangers 60, 63 include a plurality of spaced apart fins 64 that extend transversely to the opening 14. The cooling air from the inlet plenum 46 is forced into the heat exchangers 60, 63 and flows between the fins 64 across the card guide 16 to collect the heat therein. The fins 64 increase the surface area exposed to the cooling air and increase the heat removal capacity. As the operation of the internal electronics modules 36 heat the upper and lower card guides, air flowing between the fins 64 acts to draw heat away from the internal electronics modules 36 providing the cooling. The inlet plenum 46 provides cooling air to both the upper, lower and medial heat exchangers.

The spacing between the cooling fin 64 and the height and width of the cooling fin 64, is defined by the desired amount of air flow to provide the desired amount of cooling, as is understood in the art. In alternative variations, the rack 10 can include a plurality of stacked layers where internal electronics modules 36 are positioned between card guides and each separate layer, as disclosed, and cooling is provided at each layer in the manner as discussed herein.

The above described process of providing cooling of electronics modules in an electronics rack has been effective in removing heat from electronics modules. However, the overall electronics packaging density of the system and efficiency of the heat exchanger is reduced because only one side of the upper and lower heat exchangers 60, 63 is being utilized. Because the size and weight of the electronic system may be an important perimeter in different types of systems, it may be desirable to provide an electronics rack that allows for the mounting of a protected external electronic module which utilizes the exposed surfaces of two heat exchangers. It is therefore an object of the present invention to provide an electronics rack which is capable of accepting externally mounted electronics modules and efficiently takes advantage of the top heat exchanger arrangement.

SUMMARY OF THE INVENTION

In accordance with the teaching of the present invention, a rack for a plurality of electronics modules is disclosed where the rack allows for the mounting of external electronic modules.

The present invention proposes an external electronics module which is configured to mount to the exterior of the chassis while utilizing the existing interconnect media and cooling pass provided for the modular electronics packaged inside the enclosure. The external electronics module enclosure provides the required environmental protection and many combinations of interface hardware provide mechanisms for the external electronics module insertion/removal and external electronics module to chassis cold wall clamping for efficient heat transfer. Blind mate electrical connectors (both currently in the art and those yet conceived) provide an electrical interface to the rest of the electronics packaged within the enclosure.

Additional objects, features and advantages of the invention will become apparent from a consideration of the following description and appended claims when taken in connection with the accompanying drawings.

BRIEF DESCRIPTION OF THE DRAWINGS

FIG. 4 is a top view of the external electronics module shown in FIG. 3;

FIG. 5 is a rear view of the external electronic module used in the rack shown in FIG. 3;

FIG. 6 is a front view of the external electronics module used in the rack shown in FIG. 3; and FIG. 7 is a side view of the rack shown in FIG. 3 through line 7—7.

DETAILED DESCRIPTION OF THE PREFERRED EMBODIMENTS

The following discussion of the preferred embodiments is directed to a rack having a plurality of heat exchangers for electronic modules is merely exemplary in nature, and is no way intended to limit the invention or its applications or uses.

Figure 1:
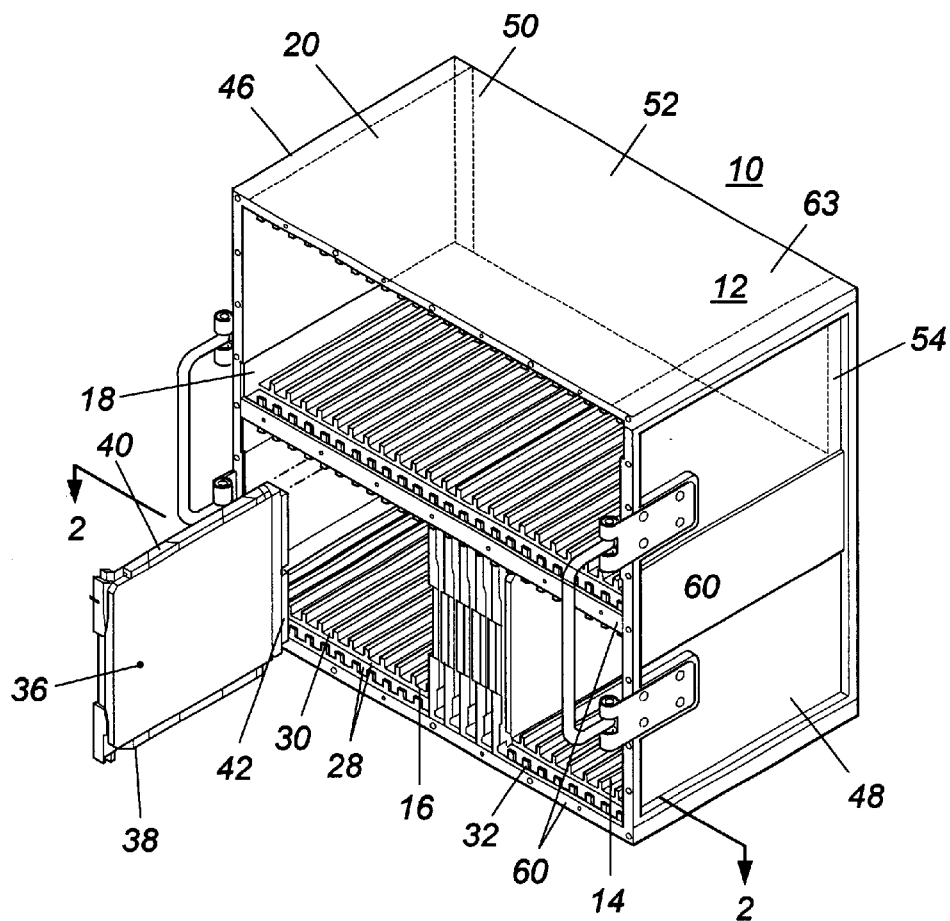
FIG. 1 is a perspective view of a rack, known in the art, for mounting a plurality of electronics modules.
Figure 2:
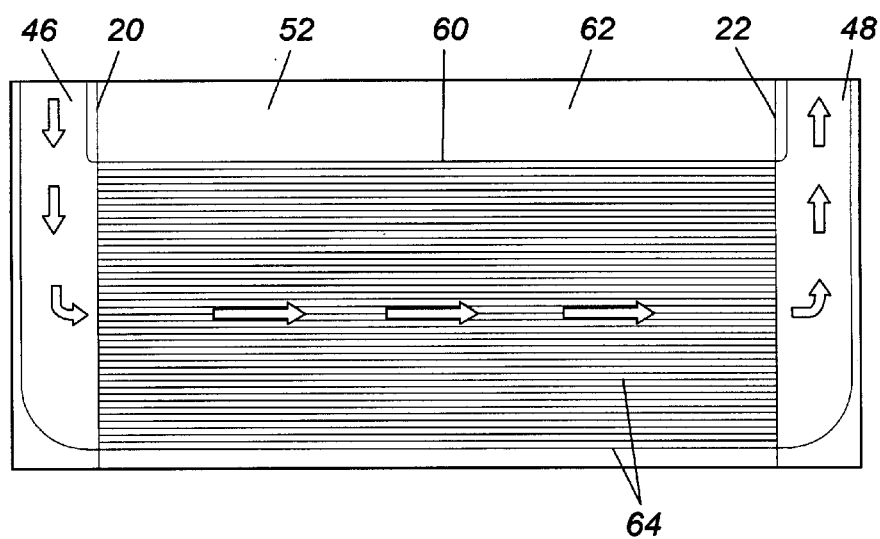
FIG. 2 is a cross-sectional view through line 2—2 of rack shown in FIG. 1.
Figure 3:
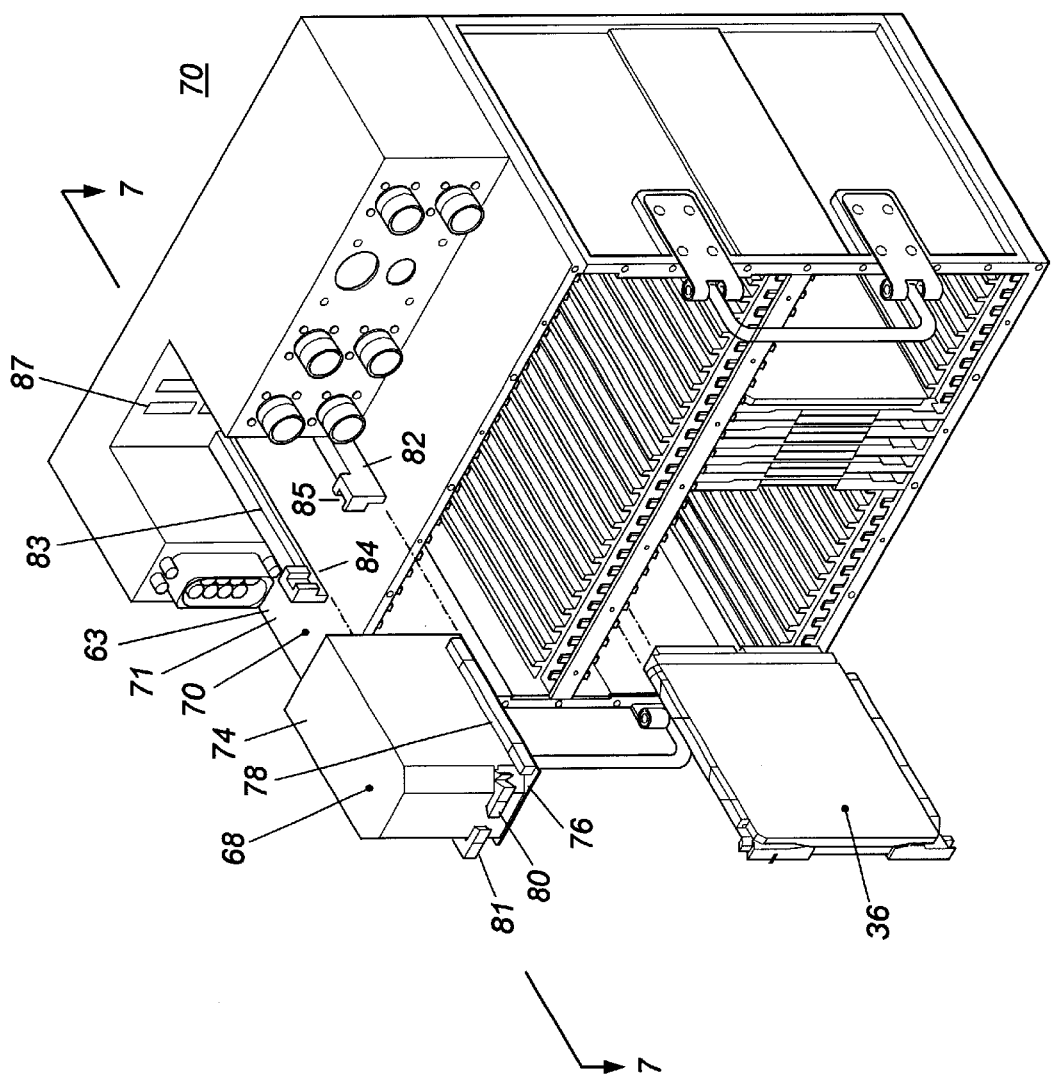
FIG. 3 is a perspective view of a rack for mounting a plurality of electronic modules, where the rack includes mounting for an external electronic module, according to an embodiment of the present invention.

FIG. 3 is a perspective view of an electronics rack 70, according to an 16 embodiment of the present invention. FIGS. 4–7 are views of the external electronics module 68. The rack 70 can be used to hold and connect the same types of internal electronics modules 36 as the rack 10, and therefore like components are defined by the same reference numerals and are described above. The rack 70 can also be used to hold and connect a plurality of external electronic modules 68 onto the top surface 71 of the top heat exchanger 63. Unlike the internal electronics modules 36, which are mounted with the rack 70, the external electronics module 68 is mounted to the rack 70 top surface 71. Volume efficiency is improved since no additional volume needs to be allocated for heat exchangers 60, 63. The external electronics module uses the existing racks 70 features for cooling. The external electronics module cover 74 provides its internal components environmental protection. In this embodiment, a single external electronics module is shown, but in alternate designs, variations in the numbers of modules coupled to the top heat exchanger 63 may be desired.

Each external electronics module 68 has a pair of parallel wedge clamps 78, 79 which are mounted to a coupling surface 76 of the external electronics module cover 74. The coupling surface 76 is preferably aluminum and allows for a proper thermal coupling of the external electronics module 68 with the top surface 71 of the top heat exchanger 63.

The top surface 71 of the top heat exchanger 63 has a pair of rails 82, 83 which function to engage the wedge clamps 78, 79. Each rail 82, 83 further has locking portions 84, 85 for engaging the lever injector/ejectors 80, 81 which are mounted to the external electronics module cover 74.

When the external electronics module 68 is slid into the top surface 71 of the top heat exchanger 63, each wedge clamp 78, 79 is slid into its corresponding rail 82, 83 on the top surface 71 and an lever injector/ejector 80, 81 is snapped into its corresponding locking portion 84, 85. When the external electronics module 68 is slid into the rack 70 an electrical connector 86 is electrically connected to a mating electrical connector 87 at the back of the rack 70 to provide the desired electrical connection. Multiple external electronics modules 68 can be slid onto the top surface 71 in a parallel format to provide the overall electrical system. It is generally desirable to set the spacing of the rails 82 and the size of the external electronics module 68 to allow as many external electronics module 68 as possible to be stored on the top surface 71 of the top heat exchanger 63 to conserve space and improve the efficiency of the top heat exchanger 63.

FIGS. 4–7 depict the external electronics module 68 of the current invention. FIGS. 4 and 6 depict the injector/ejector 80, 81 engaged with the locking portions 84, 85 of the rails 82, 83. By lifting the injectors/ejectors 80, 81, the external electronics module 68 will be extracted from electrical connector 87. Although a standard pin type connector arrangement 86, 87 is shown, a multitude of connector options are envisioned.

The external electronics module 68 generate heat during operation. The rack 70 therefore provides assisted cooling of the external electronics module 68 to draw away the heat. FIG. 7 is a cross-sectional view of the rack 70 through lines 7—7 of FIG. 3. The rails 82, 83 in conjunction with the wedge clamps 78, 79 force the coupling surface 76 of the external electronics module cover 74 into engagement with the top surface 71 of the heat exchanger 63. To provide the cooling, forced air is caused to circulate within the top heat exchanger 63 to draw heat away from the internal electronics modules 36 and the external electronics module 68. As the external electronics module 68 are not positioned within the rack 10, cooling is also possible by convection about the external electronics module cover 74.

The foregoing discussion discloses and describes merely exemplary embodiments of that the present invention. One skilled in the art will readily recognize from such discussion, and from the accompanying drawings and claims, that various changes, modifications and variations can be made therein without departing from the spirit and scope of the invention as defined in the following claims.

What is claimed is:

1. An electronics rack comprising:
   a housing including at least a top panel having internal and external surfaces, a bottom panel;
   an exterior electronics module;
   a first module guide disposed on said external surface, said first module guide configured to accept said external electronics module that are slid onto the housing;
   a second module guide positioned on the internal surface, said second module guide configured to accept a plurality of internal electronics modules in parallel arrangement; and
   on said top panel external surface a heat exchanger disposed below the external electronics module to remove heat generated by the external electronics module.

2. The rack according to claim 1 wherein the external electronics module has a coupling surface which engages the external surface to dissipate heat from the external electronics module.

3. The rack according to claim 2 wherein said external electronics module has at least one wedge clamp which engages the first module guide.

4. The rack according to claim 2 wherein said first module guide has a locking portion; and the external electronics module has an injector/ejector which engages the locking portions to hold the external electronics module to the rack.

5. The rack according to claim 2 wherein the external electronics module has a first electrical connector; and said rack has a second electrical connector capable of engagement with said first electrical connector.

6. The rack according to claim 2 wherein the heat exchanger is disposed between the external surface and the second module guide.

7. The rack according to claim 2 wherein the heat exchanger is capable of receiving coolant to extract heat from the external electronics module.

8. The rack according to claim 2 wherein the external surface is a surface of the heat exchanger.

9. The rack according to claim 1 comprising:

a plurality of externally mounted electronics modules.

10. The electronics rack according to claim 1 wherein the heat exchanger is further capable of extracting heat from said external electronics module.

11. The rack according to claim 1 wherein the heat exchanger has a plurality of fins in communication with a coolant.

* * * * *

UNITED STATES PATENT AND TRADEMARK OFFICE
CERTIFICATE OF CORRECTION

PATENT NO. : 6,272,016 B1　　　　　　　　　　　　　　　　　　　　　　　　Page 1 of 1
DATED : August 7, 2001
INVENTOR(S) : Richard A. Matonis et al.

It is certified that error appears in the above-identified patent and that said Letters Patent is hereby corrected as shown below:

<u>Title page,</u>
Item [73], Assignee, insert -- TRW Inc., Redondo Beach, CA (US) --.

Signed and Sealed this

First Day of January, 2002

Attest:

Attesting Officer

JAMES E. ROGAN
*Director of the United States Patent and Trademark Office*